United States Patent [19]

Hamada

[11] Patent Number: 5,203,061
[45] Date of Patent: Apr. 20, 1993

[54] WORKING APPARATUS HAVING WORKING HEAD MOVABLE IN X-Y DIRECTIONS

[75] Inventor: Shozi Hamada, Kakogawa, Japan

[73] Assignee: Sanyo Electric Co., Ltd., Osaka, Japan

[21] Appl. No.: 834,826

[22] Filed: Feb. 13, 1992

[30] Foreign Application Priority Data

Feb. 14, 1991 [JP] Japan .................. 3-020990

[51] Int. Cl.$^5$ .................. H01R 43/00; B21F 27/00
[52] U.S. Cl. .................. 29/33 M; 29/755; 33/1 M; 140/93 R; 248/913; 409/109
[58] Field of Search .................. 29/565, 755, 54, 33 M, 29/564.7, 564.8; 140/93 R; 33/1 M, 23.03; 409/107, 109; 248/661, 913; 74/479 R, 479 PH, 479 PF, 479 MF; 414/749; 901/41

[56] References Cited

U.S. PATENT DOCUMENTS

| | | | |
|---|---|---|---|
| 3,907,007 | 9/1975 | Hobbs et al. | 140/93 R |
| 4,030,527 | 6/1977 | Roch | 29/56.5 X |
| 4,033,386 | 7/1977 | Wood | 29/755 X |
| 4,704,792 | 11/1987 | Itagaki | 29/741 |
| 4,731,923 | 3/1988 | Yagi | 29/833 |
| 4,735,341 | 4/1988 | Hamilton | 221/1 |
| 4,817,851 | 4/1989 | Kolesar | 228/119 |

FOREIGN PATENT DOCUMENTS

| | | |
|---|---|---|
| 63-147230 | 9/1988 | Japan . |
| 1-177930 | 7/1989 | Japan . |
| 2-78300 | 3/1990 | Japan . |
| 2136332 | 9/1984 | United Kingdom .......... 29/54 |

Primary Examiner—William Briggs
Attorney, Agent, or Firm—Armstrong, Westerman, Hattori, McLeland & Naughton

[57] ABSTRACT

A working apparatus includes a pair of supports which are provided on a base, and a pair of parallelly disposed linear servo-motors each of which is settled on each of the supports. Sliders of the linear servo-motors support the ends of a beam so that the beam extends perpendicular to the servo-motors and is moved according to the simultaneous movements of the sliders. Another linear servo-motor is provided on the beam, and the slider of this motor bears a working head. The working head is moved along the beam in accordance with the slider movement.

7 Claims, 6 Drawing Sheets

WORKING APPARATUS HAVING WORKING HEAD MOVABLE IN X-Y DIRECTIONS

BACKGROUND OF THE INVENTION

1. Field of the Invention

The present invention generally relates to a working apparatus. More specifically, the present invention relates to an apparatus which is operative to cause movements in both X-direction and Y-direction in working heads so as to perform various works.

2. Description of the prior art

Automatic apparatus having movable working heads are well-known and used in various fields. They are basically cartesian-coordinates robots, and have working heads at their hand portions. Japanese Patent Laid-open Nos. Hei 1-177930 and 2-78300, and Japanese Utility Model Laid-open No. Sho 63-147230 disclose such apparatuses.

Though the apparatuses disclosed in Japanese Patent Laid-open No. Hei 1-177930 and Japanese Utility Model Laid-open No. Sho 63-147230 adopt a system utilizing a belt for pulling a working head in order to cause movements in X-direction and Y-direction, such system is not suitable for high-accuracy positional adjustment. For this reason, ball-screw is used in many apparatuses. However, the use of ball-screws does not ensure 10-micron-level positional accuracy. Furthermore, it is almost impossible to attain micron-order accuracy through conventional machine elements.

SUMMARY OF THE INVENTION

Therefore, a principal object of the present invention is to provide a novel working apparatus.

Another object of the present invention is to provide a working apparatus which ensures higher accuracy.

According to the present invention, a working apparatus is provided a working head, a beam, and a pair of supports body for supporting the beam. The working head is mounted on the beam in the manner that it can move along the beam length. The beam itself is so supported that it can be shifted laterally. The abovedescribed constitution is similar to that of a conventional cartesian-coordinates robot. However, the present invention takes the use of a pair of linear servo-motors for moving the beam as its characteristic.

Moreover, the beam itself is provided with a servo-motor means, to which the working head is coupled.

Furthermore, a plurality of sliders are provided on each of the linear servo-motor means, and these sliders are coupled to respective both ends of a plurality of beams so that the beams can be independently moved by the linear servo-motor means.

Still further, also the linear servo-motor on the beam is provided with a plurality of sliders, to which a plurality of working heads are respectively coupled so that single linear servo-motor means can independently move the working head.

Upon causing parallel movements of a pair of sliders coupled to the beam by synchronous actuation of the linear servo-motors, the beam shifts or moves in parallel motion. With this mechanism, a movement in one direction (Y-direction) is given to the working heads. On the other hand, the linear servo-motor means on the beam causes another movement of the working heads in the other direction (X-direction). In the case where a plurality of beams are incorporated with a pair of linear servo-motor means, each beam can independently be moved in Y-direction. In the case where a plurality of working heads are incorporated with the linear servo-motor means on the beam, each working head can independently be moved independently in X-direction.

According to the present invention, high-accuracy positioning (including repetitive positioning), which matches the resolution degree (about 1 micron) of the linear servo-motor's position detector, can be realized. Since a pair of linear servo-motors are provided for a beam in order to move it by applying forces to both ends thereof, any twist or fluctuation of the beam can be prevented from being generated. Speed of the beam or the working head is remarkably increased in comparison to that of a ball-screw construction. Moreover, linear servo-motors are substantially free of abrasion, and ensure high-accuracy operation for longer period than ball-screw means. Furthermore, since a linear servo-motor can be provided with a plurality of sliders, the number of beams or working heads can be increased without increasing the number of the motor itself.

The objects and other objects, features, aspects and advantages of the present invention will become more apparent from the following detailed description of the embodiments of the present invention when taken in conjunction with accompanying drawings.

DETAILED DESCRIPTION OF THE PREFERRED EMBODIMENTS

Figure 1:
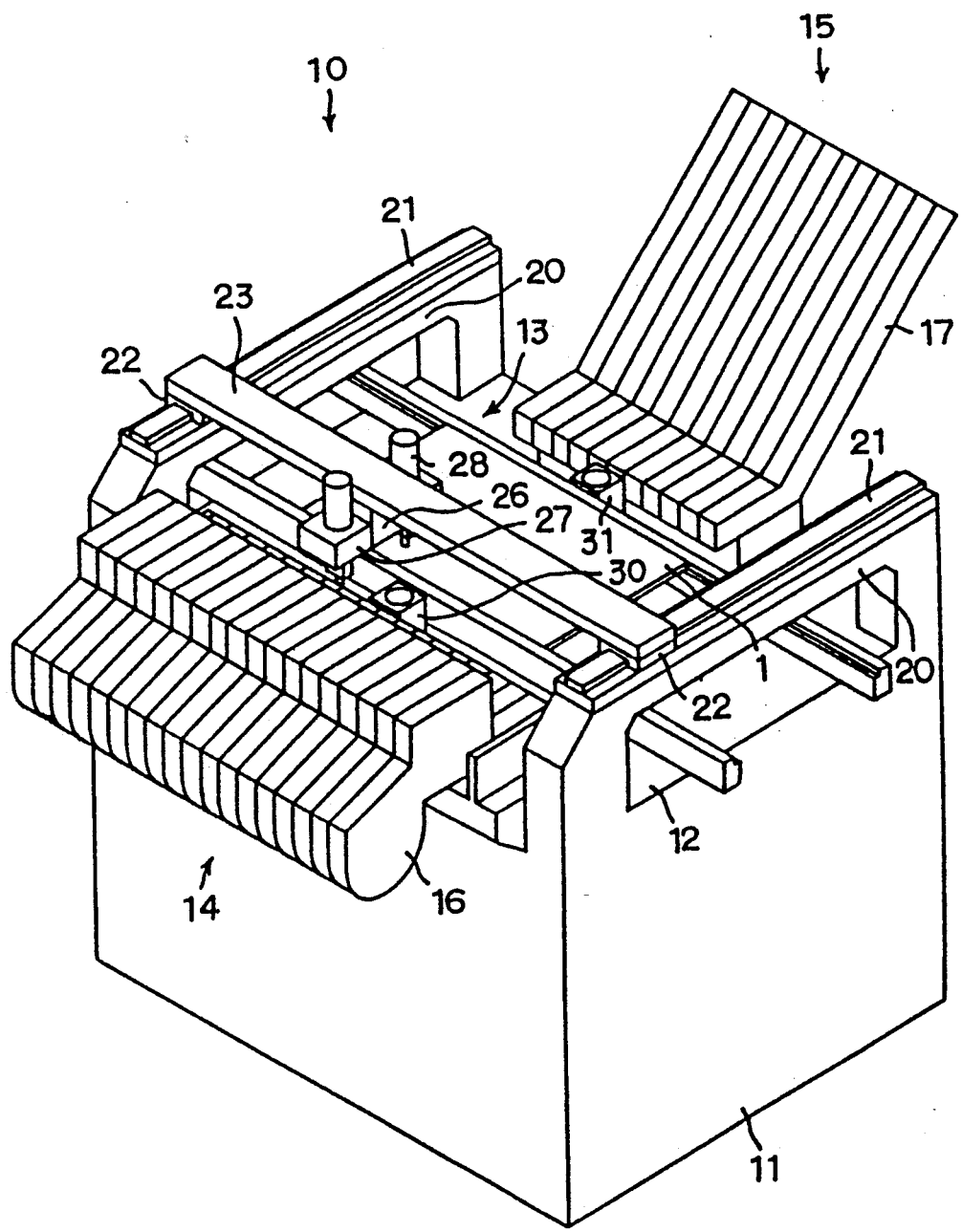
FIG. 1 is a perspective view of a first preferred embodiment of a working apparatus.
Figure 2:
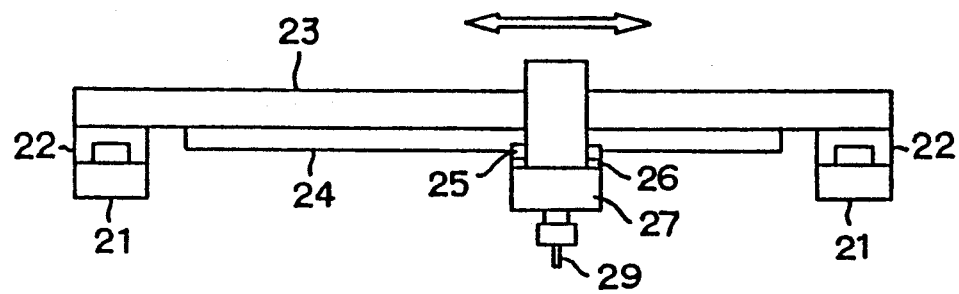
FIG. 2 is a front view of a beam portion of the working apparatus shown in FIG. 1.
Figure 3:
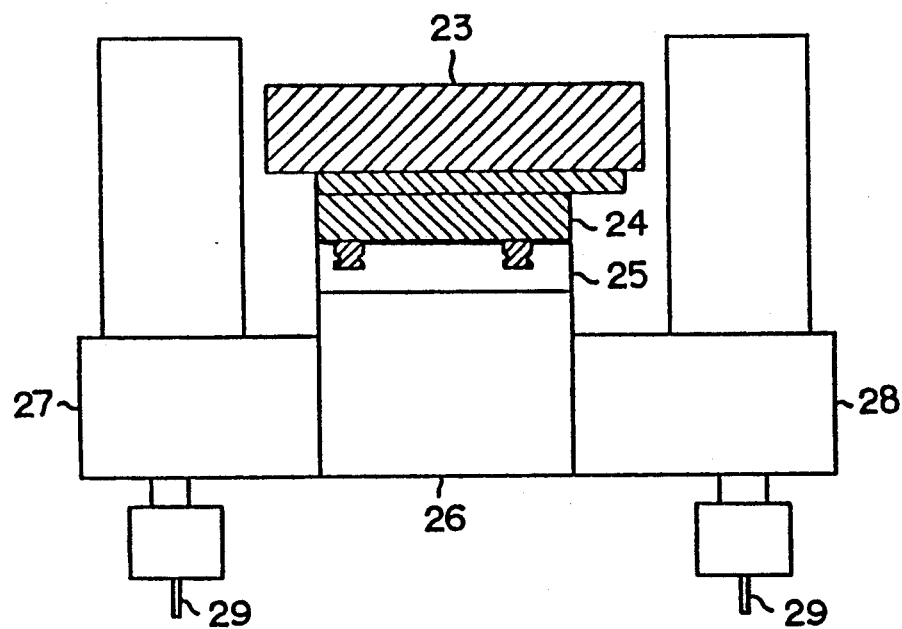
FIG. 3 is a cross-sectional view of the beam portion of the working apparatus shown in FIG. 2.

FIGS. 1 to 3 show the first preferred embodiment. A working apparatus 10 is adapted to perform a work for mounting electronic components on a circuit board 1. The working apparatus 10 has a base 11, and various elements are disposed on a table portion on the top of the base 11. More specifically, a reference humeral 13 denotes a conveyor passing the center of the table portion 12. A reference numeral 14 designates a first component supply unit disposed on one side of the conveyor 13. A reference numeral 15 stands for a second component supply unit disposed on the other side of the conveyor 13. The conveyor 13 plays a role of bringing in and taking out the circuit board 1, and of positioning the circuit board 1 at a working position. The first component supply unit 14 is a plurality of component supply devices 16 arranged in a lateral row. Each of the component supply devices 16 has a tape containing components at a certain pitch. Since component supply by way of tape is well known, as seen in U.S. Pat. No. 4,735,341, detailed explanation concerning it is omitted here. In the same manner, the second component supply unit 15 is constituted of a plurality of part supply devices 17 arranged along the feed direction of the conveyor 13 in a lateral row. Each of the component supply devices 17 is adapted to feed a part from a slant magazine of stick type. Detailed explanation of the device 17 is also omitted here since this kind of component supply device is also well-known, for example, as shown in U.S. Pat. No. 4,731,923.

At both ends of the table portion 12, supporting bars 20 are disposed at a height above the table surface so as to extend horizontally and perpendicularly to the conveyor 13. The supporting bars 20 are parallel with each other, and a linear servo-motors 21 is fixed on each of them. As a linear servo-motor, a product named "NSK MEGA THRUST MOTOR" manufactured by NIPPON SEIKO K.K. is recommended for this purpose. As for control of linear servo-motors, U.S. Pat. No. 4,704,792 sufficiently discloses the technology and, therefore, is referred here.

A beam 23 is fixed at its ends to the sliders 22 of a pair of linear servo-motors 21. More specifically, the beam 23 is supported on the sliders 22 of the pair of linear servo-motors 21 so as to be moved by cooperation between sliders 22. As a matter of course, the beam 23 needs to be moved with its angle kept constant during a shifting operation. For obtaining parallel motion, it is required to control both linear servo-motors 21 in a synchronized manner. The direction of movement of sliders 22 is perpendicular to the longitudinal expanse of beam 23 or the circuit board feeding direction of the conveyor 13. Hereinafter, the direction of movement of slider 22 is defined as the Y-direction.

Another linear servo-motor 24 is attached on the underside of the beam 23, and a head mount 26 is fixed to the slider 25 of the linear servo-motor 24. Although the head mount 26 is suspended from the linear servo-motor 24, this suspension causes no problem since the slider 25 has a structure strong enough to bear a load applied in this direction. A pair of working heads 27 and 28 are mounted on the head mount 26, each positioning at opposite side of the beam 23. The working heads 27 and 28 move along the beam 23 in accordance with the movement of the slider 25. This direction of working head movement is defined as X-direction. Each working head 27 and 28 has a suction nozzle 29. Displacement in the vertical direction (i.e., Z-direction) is given to the suction nozzle 29 by means of an accommodated air-cylinder or linear servo-motor (not shown). Angular displacement around the Z-axis (i.e., theta displacement) is applied to the vacuum-type absorption nozzle 29 by means of an accommodated pulse motor (not shown).

In addition, in the drawing, reference numerals 30 and 31 denote cameras interposed between the first component supply portion 14 and the conveyor 13 and between the second component supply portion 15 and the conveyor 13, respectively. Each camera constitutes a part of an optical recognition device for measuring the displacement of a component from the nozzle center.

The operation of the working apparatus 10 is as follows. At first, the conveyor 13 transports a circuit board 1 from the conveyor inlet and stops it at the working position. Adhesive is applied in advance onto the board 1 at positions assigned to component mounting. Then, the linear servo-motors 21 and 24 are actuated to shift the beam 23 in Y-direction and the head mount 26 in X-direction, so that the suction nozzles 29 reaches above predetermined one of the component supply devices. The working head 27 is assigned to cooperate-with the first component supply portion 14. The suction nozzle 29 is descended onto the selected component supply device 16 and picks up a component. After component picking, the working head 27 is placed on the camera 30 for measurement of the displacement of the component. Upon correction of measured displacement by amending X-Y positional shift and nozzle rotation, the component is put on the board 1. In case a component is to be taken out from the second component supply unit 15, the working head 28 is shifted on the target component supply device 17. Then, the component is picked up, and the camera 31 measures its displacement of the part. After completion of displacement correction, the component is disposed on the circuit board 1. When the programmed component mounting work is finished, the conveyor 13 carries the board away to the conveyor outlet and brings new one in.

Figure 4:
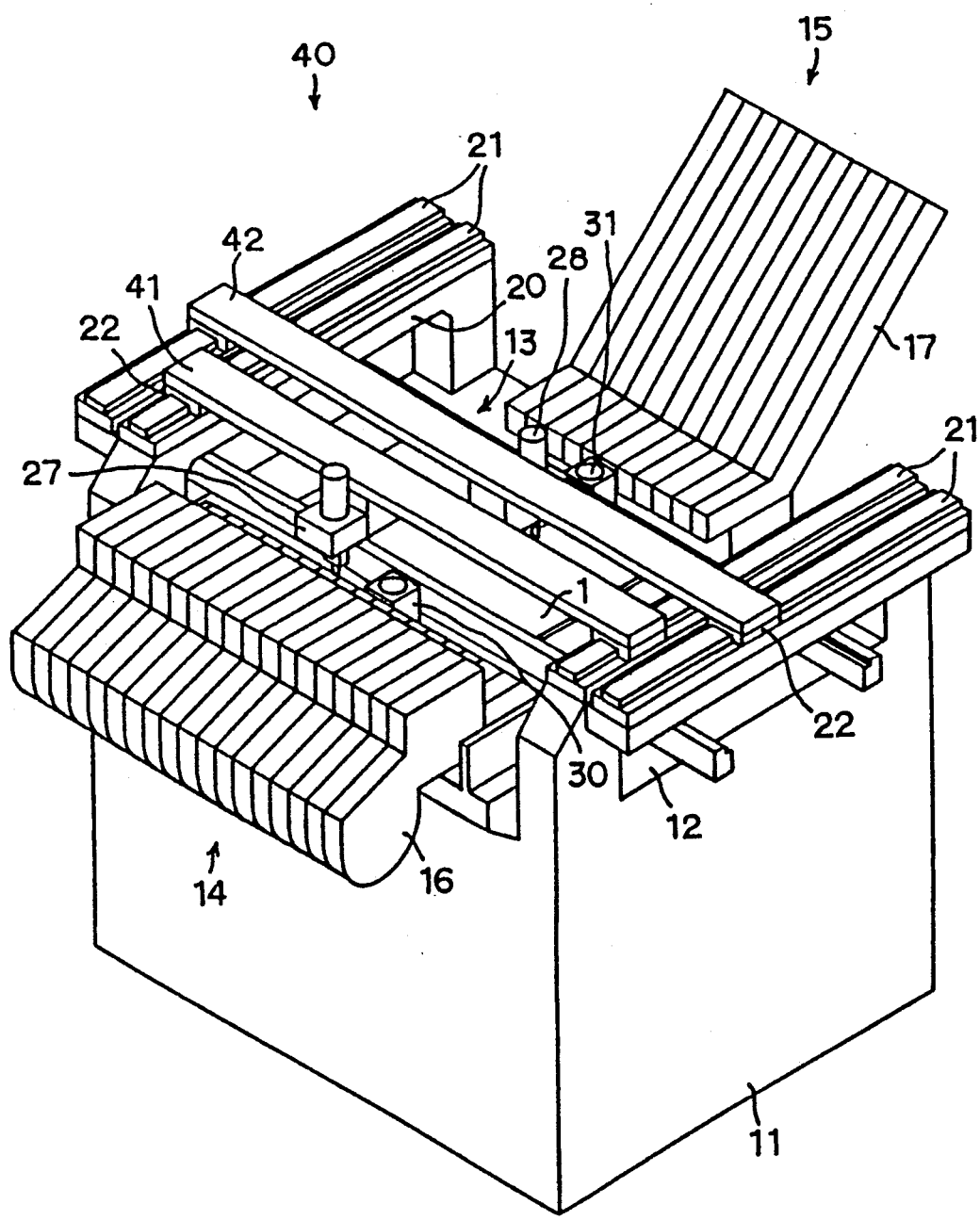
FIG. 4 is a perspective view of a second preferred embodiment of a working apparatus.
Figure 5A:
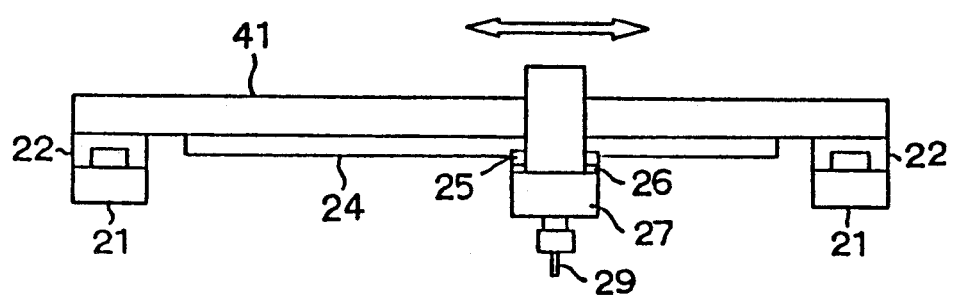
FIGS. 5A and 5B are front views of beam portions of the working apparatus shown in FIG. 4.
Figure 5B:
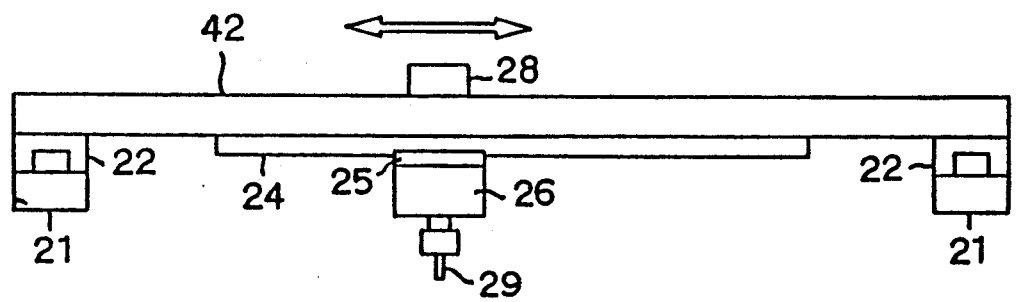

FIGS. 4 and 5 show the second preferred embodiment. Elements which are common to the first embodiment are given the same reference numerals, and the explanations concerning them are omitted here. In this embodiment, there are two pairs of linear servo-motors 21 and also two beams in the working apparatus 40. The working head 27 on the beam 41 is assigned to component picking from the first component supply unit 14, while the working head 28 on the other beam 42 serves for component picking from the second component supply unit 15. With this arrangement, while one working head is carrying out either one of the component picking-up operation, the component displacement measuring operation, and the component disposing operation, the other head can perform the same or other operation at the same time. Hereby working efficiency is more enhanced.

Figure 6:
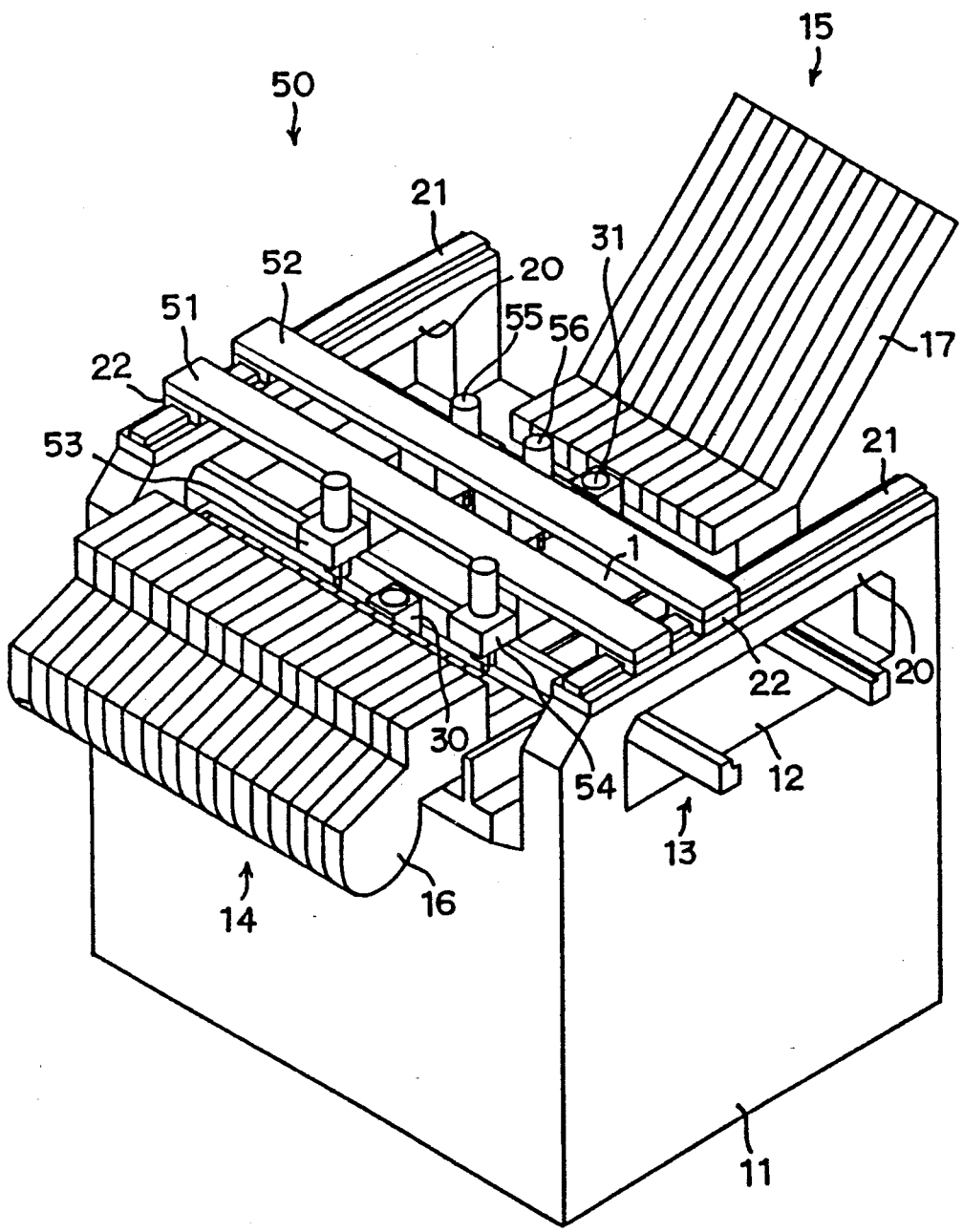
FIG. 6 is a perspective view of a third preferred embodiment of a working apparatus.
Figure 7A:
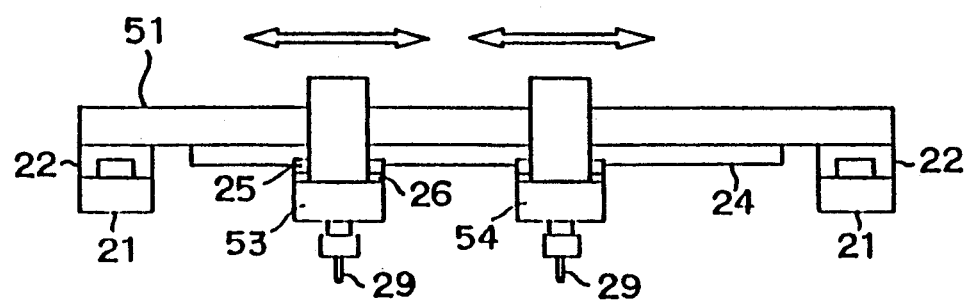
FIGS. 7A and 7B are front views of beam portions of the working apparatus shown in FIG. 6.
Figure 7B:
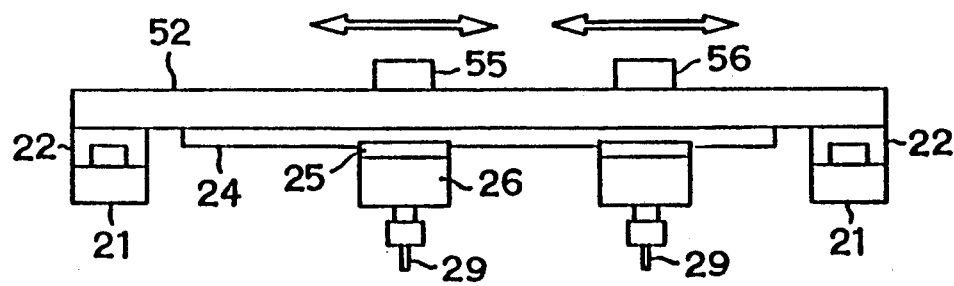

FIGS. 6 and 7 show the third preferred embodiment. In the working apparatus 50, a characteristic of linear servo-motor that a single one can have a plurality of sliders and can actuate them independently is utilized. So, the linear servo-motors 21 and 24 have two sliders 22 and 25 each. And two beams are provided for respectively supporting two head mounts. A beam 51 has working heads 53 and 54 for the first component supply unit 14, while the other beam 52 has working heads 55 and 56 for the second component supply unit 15. With this arrangement, each of the beams 51 and 52, and each of the working heads 53, 54, 55 and 56 can be independently actuated, thereby further efficiency in working operation is obtained.

Although the working heads explained in the foregoing embodiments are provided with a suction nozzle for the purpose of component disposing, the type of the working head is not limited to this. It is possible to incorporate a camera for recognition of fiducial marks or circuit pattern on a circuit board, or bad marks indicative of work prohibition (especially in the case of boards that are to be split into several pieces after component mounting.) An adhesive dispenser can, too, be attached to it. It is also possible to combine plural types of working heads on a single head mount (for example, a component disposing type and an optical recognition type).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A working apparatus, comprising:
a base;
a pair of supports provided on said base;
first and second linear servo-motor means provided on said supports in parallel to each other, said first and second linear servo-motor means including slider means, respectively;
beam means both end of which are coupled to said slider means of said first and second linear servo-motor means;
third linear servo motor means mounted on said beam means and including a plurality of sliders;
a plurality of working head means each coupled to one of said plurality of sliders on said beam means;
driving means for moving said working head means in said longitudinal direction; and
control means for controlling said first and second linear servo-motor means so that said beam is moved in parallel motion by said sliders wherein said first and second linear servo-motor means include a plurality of first sliders and a plurality of second sliders, respectively, and each of said first sliders is paired with its counterpart in said second sliders so as to constitute a plurality of slider pairs, and said beam means includes a plurality of beams each of which is coupled to one of said slider pairs, and said control means controls said slider pairs independently.

2. A working apparatus in accordance with claim 1, wherein said third linear servo-motor means includes a plurality of sliders, and said working head means includes a plurality of working heads coupled to said sliders, respectively, and said control means controls said sliders independently.

3. A working apparatus, comprising:
a base;
a pair of supports provided on said base;
first and second linear servo-motor means provided on said supports in parallel to each other, said first and second linear servo-motor means including slider means, respectively;
beam means both ends of which are coupled to said slider means of said first and second linear servo-motor means;
third linear servo-motor means mounted on said beam means and including a plurality of sliders;
a plurality of working head means each coupled to one of sid plurality of sliders on said beam means;
driving means for moving said working head means in said longitudinal direction; and
control means for controlling said first, second and third linear servo-motor means so that said beam is moved in parallel motion by said sliders, and for independently controlling each of said plurality of sliders on said beam means.

4. A working apparatus, comprising:
a base;
a pair of supports provided on said base;
first and second linear servo-motor means provided on sid supports in parallel to each other, said first and second linear servo-motor means including slider means, respectively;
beam means both ends of which are coupled to said slider means of said first and second linear servo-motor means;
a plurality of working head means each coupled to one of said plurality of sliders on said beam means;
driving means for moving said working head means in said longitudinal direction; and
control means for controlling said first and second linear servo-motor means so that said beam is moved in parallel motion by said sliders wherein said first and second linear servo-motor means includes a plurality of first linear servo-motors and a plurality of second linear servo-motors, respectively, and each of said fist linear servo-motors is paired with its counterpart in said second linear servo-motors so as to constitute a plurality of linear servo-motor pairs, and said beam means includes a plurality of beams each of which is coupled to one of said linear servo-motor pairs.

5. A working apparatus, comprising:
a base;
a pair of supports provided on said base;
first and second linear servo-motor means provided on said supports in parallel to each other, said first and second linear servo-motor means including slider means, respectively;
beam means both ends of which are coupled to said slider means of said first and second linear servo-motor means;
third linear servo motor means mounted on said beam means and including a plurality of sliders;
a plurality of working head means each coupled to one of sid plurality of sliders on said beam means;
driving means for moving said working head means in said longitudinal direction; and
control means for controlling said first and second linear servo-motor means so that said beam is moved in parallel motion by said sliders wherein said first and second linear servo-motor means include a plurality of first linear servo-motors and a plurality of second linear servo-motors, respectively, and each of said first linear servo-motors is paired with its counterpart in said second linear servo-motors so as to constitute a plurality of linear servo-motor pairs, and said beam means includes a plurality of beams each of which is coupled to one of said linear servo-motor pairs.

6. A working apparatus in accordance with claim 4, wherein said third linear servo-motor means includes a plurality of sliders, and said working head means includes a plurality of working heads coupled to said of sliders, respectively, and said control means controls said sliders independently.

7. A working apparatus, comprising:
a base;
a pair of supports provided on said base;
first and second linear servo-motor means provided on said supports in parallel to each other, said first and second linear servo-motor means including slider means, respectively;
beam means both ends of which are coupled to said slider means of said first and second linear servo-motor means;
a plurality of working head means each coupled to one of said plurality of sliders on said beam means;
driving means for moving said working head means in said longitudinal direction; and
control means for controlling said first and second linear servo-motor means so that said beam is moved in parallel motion by said sliders wherein said first and second linear servo-motor means include a plurality of first sliders and a plurality of second sliders, respectively, and each of said first sliders is paired with its counterpart in said second sliders so as to constitute a plurality of slider pairs, and said beam means includes a plurality of beams each of which is coupled to one of said slider pairs, and said control means controls said slider pairs independently.

* * * * *